United States Patent
Kloth et al.

(10) Patent No.: US 8,847,241 B2
(45) Date of Patent: Sep. 30, 2014

(54) SURFACE-EMITTING SEMICONDUCTOR LIGHT-EMITTING DIODE

(75) Inventors: Bernd Kloth, Birkenwerder (DE); Vera Abrosimova, Berlin (DE); Torsten Trenkler, Berlin (DE)

(73) Assignee: JENOPTIK Polymer Systems GmbH, Triptis (DE)

( * ) Notice: Subject to any disclaimer, the term of this patent is extended or adjusted under 35 U.S.C. 154(b) by 8 days.

(21) Appl. No.: 13/638,810

(22) PCT Filed: Mar. 31, 2011

(86) PCT No.: PCT/DE2011/050009
§ 371 (c)(1),
(2), (4) Date: Oct. 1, 2012

(87) PCT Pub. No.: WO2011/120513
PCT Pub. Date: Oct. 6, 2011

(65) Prior Publication Data
US 2013/0026447 A1    Jan. 31, 2013

(30) Foreign Application Priority Data
Apr. 1, 2010  (DE) .......................... 10 2010 014 177

(51) Int. Cl.
*H01L 33/04* (2010.01)
*H01L 33/14* (2010.01)
*H01L 33/00* (2010.01)
*H01L 27/15* (2006.01)

(52) U.S. Cl.
CPC ............. *H01L 33/14* (2013.01); *H01L 33/0095* (2013.01); *H01L 27/156* (2013.01)
USPC ......................... 257/79; 257/13; 257/E33.005

(58) Field of Classification Search
USPC ............................................. 257/13, E33.005
See application file for complete search history.

(56) References Cited

U.S. PATENT DOCUMENTS

| 4,956,583 | A | | 9/1990 | Lawrence et al. |
| 5,216,263 | A | | 6/1993 | Paoli |
| 5,337,074 | A | | 8/1994 | Thornton |
| 5,663,581 | A | * | 9/1997 | Holm et al. ..................... 257/93 |

(Continued)

FOREIGN PATENT DOCUMENTS

| DE | 37 09 301 A1 | 10/1988 |
| DE | 199 18 651 A1 | 10/2000 |

(Continued)

*Primary Examiner* — Zandra Smith
*Assistant Examiner* — Damian A Hillman
(74) *Attorney, Agent, or Firm* — Duane Morris LLP

(57) ABSTRACT

The invention is directed to a surface emitting semiconductor light-emitting diode (LED) in which a reflector layer (4) of the first conductivity type is provided between a substrate (2) and a first barrier layer (5). A first contact layer (9) has at least one emitting surface (13) via which radiation emitted by an active layer (6) exits the LED. The emitting surfaces (13) are electrically and optically isolated from one another by surface implanted regions (11) in the first contact layer (9) which are irradiated with electric charge carriers. The areas of the layers located below the emitting surface (13) starting from the first contact layer (9) and proceeding as far as at least through the active layer (6) are electrically and optically isolated with respect to areas of the layers not located below the emitting surface (13) by means of first deep implanted regions (12.1) irradiated with electric charge carriers.

25 Claims, 11 Drawing Sheets

(56) References Cited

U.S. PATENT DOCUMENTS

| | | | |
|---|---|---|---|
| 5,799,030 A * | 8/1998 | Brenner | 372/50.21 |
| 5,882,948 A | 3/1999 | Jewell | |
| 5,893,721 A | 4/1999 | Huang et al. | |
| 6,177,352 B1 | 1/2001 | Schonfeld et al. | |
| 7,726,835 B2 | 6/2010 | Bogner et al. | |
| 7,787,512 B2 * | 8/2010 | Koda et al. | 372/50.124 |
| 7,811,842 B2 | 10/2010 | Liu et al. | |
| 2003/0022406 A1 | 1/2003 | Liao et al. | |
| 2007/0131961 A1 * | 6/2007 | Krames et al. | 257/103 |
| 2009/0104726 A1 | 4/2009 | Slater, Jr. et al. | |
| 2011/0275173 A1 | 11/2011 | Khaja et al. | |
| 2012/0043571 A1 * | 2/2012 | Chu et al. | 257/98 |

FOREIGN PATENT DOCUMENTS

| | | |
|---|---|---|
| EP | 0 493 055 A2 | 12/1991 |
| EP | 0 683 526 A1 | 4/1995 |
| EP | 1 347 504 A2 | 9/2003 |
| JP | 2012-054492 A | 3/2012 |
| WO | WO 2006/044894 A2 | 4/2006 |
| WO | WO 2010/112383 A1 | 10/2010 |
| WO | WO 2012/029197 A1 | 3/2012 |

* cited by examiner

SURFACE-EMITTING SEMICONDUCTOR LIGHT-EMITTING DIODE

RELATED APPLICATIONS

The present application is a U.S. National Stage application of International PCT Application No. PCT/DE2011/050009 filed on Mar. 31, 2011 which claims priority benefit of German Application No. DE 10 2010 014 177.1 filed on Apr. 1, 2010, the contents of each are incorporated by reference in their entirety.

BACKGROUND OF THE INVENTION

The invention is directed to a semiconductor light-emitting diode such as is known generically from U.S. Pat. No. 5,216,263 A.

For several decades, LEDs and LED array chips have been used for displaying graphic characters. For this purpose, for example, 7-segment LED display chips were developed by means of zinc diffusion or zinc implantation in a thick, n-conducting GaAsP (gallium arsenide phosphide) layer on a GaAs (gallium arsenide) substrate and are still produced today based on the same technology. In this case, typical light intensities reach 0.1 mcd/segment when operated at 5 mA current strength. The emission wavelength is limited by the material to 650-660 nm (red light) at which the sensitivity of the human eye is only about 10%.

Other LED display components have been developed as hybrid elements in which more efficient LED chips (approximately 10% efficiency) with different emission wavelengths in the visible spectrum were combined and arranged. However, the size of these elements prohibits their use in very compact spaces, e.g., in the beam path of optical equipment.

Translucent LCD displays with LED backlighting are also used for displaying graphic characters. They are usually relatively large displays so that the LED backlighting is carried out exclusively by arrays of discrete LEDs or LED chips on a supporting board. The LEDs of an array can be controlled collectively as well as individually. The LED backlighting may be monochromatic, multicolored or white.

To allow for more compact sizes, the semiconductor layers (epitaxial structures) must be structured on a small scale and their optical and electrical characteristics adapted. In addition to diffusion, so-called implantation of protons or other electric charge carriers through irradiation can alter or even destroy the crystal structure so that the irradiated (implanted) areas lose their electric conductivity partially or completely. Further, these areas can be absorbent for certain wavelengths. The alteration of the crystals can be controlled through the choice of the kinetic energies imparting the electric charge carriers and through the quantity of electric charge carriers per unit area (dose) of a beam bundle used for the irradiation. In order to generate so-called deep implanted regions, the electric charge carriers are radiated onto the material with high energy but at a low dose, whereas low energies and high doses are used for generating surface implanted regions.

PRIOR ART

U.S. Pat. No. 5,216,263 A describes a surface emitting semiconductor light-emitting diode (LED) in an LED array with a series of layers arranged one on top of the other in which the series of layers comprises a layer of a substrate contact of a first conductivity type, a common substrate of the first conductivity type, a first barrier layer of the first conductivity type, a light-emitting active layer, a second barrier layer of a second conductivity type, a first contact layer of the second conductivity type with surface implanted regions in the first contact layer which are electrically isolated from one another by irradiating with protons, and a quantity of electrically conductive surface contacts for connecting the first contact layer.

A deep structuring of the semiconductor layers is achieved by generating between individual LEDs of an LED array regions which are disordered by silicon diffusion and which extend through the active layer and are electrically isolated from one another through the individual emitting areas of the active layer. Further, the disordered regions have increased absorption of the emitted radiation.

Each individual area of the active layer is controllable by means of a p-contact on the first contact layer, which p-contact is associated with this area. The substrate contact and substrate must be removed in the areas of the emitting surface so as to allow emission of radiation on the side of the semiconductor layers associated with the substrate. Through-radiation through the arranged layers is not possible.

U.S. Pat. No. 5,216,263 A specifies as substrate exclusively n-doped substrates, whereas the first contact layer is p-doped.

A solution according to U.S. Pat. No. 5,216,263 A has the disadvantage that a number of different steps are needed in the structuring of the semiconductor layers. First, there is the time-consuming silicon diffusion (7 to 8 hours) followed by irradiation with protons and, further, various etching steps. In addition, the known prior art does not disclose a solution by means of which the substrate can be both n-doped and p-doped.

Yet, an alternate applicability of differently doped substrates such as this would offer a range of additional possibilities for circuit arrangements for the operation of LEDs and the production of chips with a common anode or cathode.

OBJECT OF THE INVENTION

It is an object of the invention to provide a surface emitting semiconductor light-emitting diode which will have a higher light intensity compared to the prior art and which, in addition, can have both a common cathode and a common anode. Further, the suggested surface emitting semiconductor light-emitting diodes, while maintaining good contrast between the luminous areas and non-luminous areas, will emit wavelengths in a spectral range from 560 nm to 880 nm and have no emission from the edges of the chip. This object is met by a surface emitting semiconductor light-emitting diode (LED) having a series of layers arranged one on top of the other, wherein the series of layers includes:

a layer of a substrate contact of a first conductivity type,
a common substrate,
a first barrier layer of the first conductivity type,
a light-emitting active layer,
a second barrier layer of a second conductivity type,
a first contact layer of the second conductivity type with surface implanted regions in the first contact layer which are electrically isolated from one another by irradiating with electric charge carriers, and a quantity of electrically conductive surface contacts for connecting the first contact layer.

The LED according to the invention provides:
that the substrate comprises a semiconductor substrate and the substrate has a first conductivity type, or the substrate is an electrically insulating substrate, or the substrate comprises a metal or a composite material,
that a reflector layer of the first conductivity type is provided between the substrate and the first barrier layer, that the first contact layer has at least one emitting surface via which light emitted by the active layer exits the LED, and the emitting surfaces are electrically and optically isolated with respect to one another by surface implanted regions in the first contact layer which are irradiated with electric charge carriers, and in that the areas of the layers located below the emitting surface starting from the first contact layer and proceeding as far as at least through the active layer are electrically and optically isolated with respect to areas of the layers not located below the emitting surface by means of deep implanted regions irradiated with electric charge carriers.

SUMMARY OF THE INVENTION

The core of the invention is a surface emitting semiconductor LED which is structured on a very small scale by a few technologically similar steps and which allows high light intensities in the wavelength regions from blue to infrared radiation.

The reflector layer serves to reflect the light emitted by the active layer in direction of the emitting surfaces so that in an emission wavelength of 650 nm a high light intensity of, e.g., approximately 10 mcd (millicandela) per luminous segment is first achieved at the emitted surface. The reflector layer can be constructed in any suitable manner so as to have a sufficient reflective performance and electric conductivity. A distributed Bragg reflector is preferably used.

The emitting surfaces have an electric conductivity of a second conductivity type. In addition to the connection carried out at these emitting surfaces through surface contacts, the light emitted by the active layer also exits at these emitting surfaces. The electric conductivity of the first contact layer between the emitting surfaces is canceled by irradiation with electric charge carriers. Further, the regions of the first contact layer which are irradiated in this way have a high absorption of wavelengths of the light emitted by the active layer so that in addition to an electric isolation there is also an optical isolation of the emitting surfaces. The surface implanted regions can also be formed deeper than the first contact layer.

The emitting surface can have any shape, e.g., round, bar-shaped, polygonal or curved.

Radiation in wavelength ranges from 400 nm to 950 nm can be emitted; wavelength ranges from 560 nm to 880 nm are preferred.

Further, it is crucial that the deep implanted regions are formed as far as through the active layer in order to ensure a directed flow of current through the active layer and to prevent unwanted lateral current flows. In a preferred embodiment of the invention, the deep implanted regions extend through the first contact layer and directly border the surface implanted regions. The deep implanted regions are preferably constructed so as to extend in perpendicular direction from the first contact layer. The deep implanted regions of the individual emitting surfaces can be spaced apart from one another, adjoin one another, or merge into one another. Further, the deep implanted regions can extend as far as into different layers and can therefore form different types of deep implanted regions. Through different types of deep implanted regions, the series of layers of the LED according to the invention can be structured into regions of any shape and arrangement which are optically and electrically isolated from one another.

The optical and electric isolation formed as surface implanted or deep implanted regions is generated by irradiating the series of layers with electric charge carriers of different energies and doses. Electric charge carriers for the irradiation can be protons and ions.

The first conductivity type and the second conductivity type of the LED according to the invention are selected from a group comprising the p-doped semiconductor conductivity type and the n-doped semiconductor conductivity type; the first conductivity type and the second conductivity type differ from one another.

It is possible to use different ions as charge carriers (e.g., for converting the conductivity type from n-type to p-type and from p-type to n-type) for different materials of the layers of the LED according to the invention. For producing highly resistive zones in GaN-based semiconductors, it is possible to use ions of Si, O, N, He or Mg for charge carrier implantation. Ions of H, Li, C or O, for example, can be implanted for isolation of Zn-doped GaAs structures.

Further embodiments of the LED according to the invention can be carried out in such a way that the surface implanted regions and the deep implanted regions have coextensive horizontal dimensions but differ from one another vertically as a result of the concentration and type of electric charge carriers used for the implantation.

The surface implanted regions and the deep implanted regions can be produced consecutively in only one implantation process.

In an extremely advantageous manner, it is possible with the LED according to the invention that the epitaxial structures containing the p-n junction can be arranged on an n-doped substrate as well as on a p-doped substrate. This makes it possible to produce chips with a common anode and also with a common cathode. In so doing, depending on construction, the first contact layer and the substrate contact can be formed as anode or cathode.

The materials of the first barrier layer and second barrier layer, first contact layer and active layer are selected from a group comprising $(Al_xGa_{1-x})_{1-z}In_zP$ (aluminum gallium indium phosphide) and $(Al_xGa_{1-x})_{1-x}As$ (aluminum gallium arsenide). Particularly preferred materials are given by the value ranges $0 \leq x \leq 1$ and $0 \leq z \leq 0.6$ of the stoichiometric index. Alternatively, $In_yGa_{1-y}N$ (indium gallium nitride) can be selected as material for the first barrier layer and second barrier layer, the first contact layer and the active layer or one of the layers, where $0 \leq y \leq 0.5$. When using $In_yGa_{1-y}N$, the substrate is preferably selected from a group comprising germanium, silicon, and metal alloys.

In a further embodiment of the LED according to the invention, the materials for the first barrier layer and second barrier layer, the first contact layer and the active layer can comprise $Al_xGa_yIn_zN$, where $x+y+z=1$, $0 \leq x \leq 1$, $0 \leq y \leq 1$, $0 \leq z \leq 0.5$.

The materials are selected in such a way that the first barrier layer and the second barrier layer each have a bandgap which is greater than the bandgap of the active layer.

The active layer comprises an undoped (i-layer) or a p-doped material or n-doped material. In further embodiments, the active layer can be formed in a known manner as a quantum well (a pair of thin layers) or as multi-quantum well (multiple pairs of thin layers). The active layer is arranged no deeper than 4 μm below the emitting surface, but in preferred embodiments is arranged no deeper than 3 μm below the emitting surface.

The substrate can be any semiconductor substrate that is absorbent for the emitted radiation; GaAs (gallium arsenide) is a preferred substrate. The substrate can be p-doped or n-doped. The substrate is preferably a doped material selected from a group comprising Si, GaAs, Ge, and metal alloys.

Further, it is possible that the substrate is an electrically insulating substrate such as undoped GaAs, highly resistive silicon, or nonconductive germanium.

Further, the electrically insulating substrate can be a material selected from a group comprising sapphire, si-AlN, $MgAl_2O_4$-spinel, or metal oxides, e.g., MgO or ZnO. It is also possible that the electrically insulating substrate comprises composites, e.g., of silicon on polycrystalline silicon carbide (SopSiC).

Different materials and types of substrates, e.g., a substrate of the first conductivity type or second conductivity type and an electrically insulating substrate, can be combined, e.g., in layers one on top of the other.

The substrate can be absorbent for or transparent to the emitted radiation.

In further embodiments of the LED according to the invention, a buffer layer of the first conductivity type can be provided between the substrate and the first barrier layer to compensate for crystalline structures of layers that differ from one another. For example, this buffer layer can be a doped layer of the first conductivity type comprising GaAs.

It is advantageous when the substrate contact and the surface contacts are constructed as bonding surfaces. The substrate contact and surface contacts are then preferably covered completely or partially by a bonding layer. In this way, a simpler, more secure and sustainable contacting of the first contact layer and substrate is achieved.

In further embodiments of the LED according to the invention in which there is an electrically insulating substrate, the substrate contact can be connected to the buffer layer by at least one metallic conductor. The metallic conductor is preferably arranged in such a way that it runs through channels in the electrically insulating substrate.

It is also possible that the layers of the LED according to the invention which are to be electrically connected, particularly the buffer layer, can be connected in that micro-holes which are filled with electrically conducting material are provided in the insulating substrate. Micro-holes are perforations having a clear diameter of a maximum of 10 µm.

In so doing, it is advantageous when the substrate contact is an omnidirectional reflector. An omnidirectional reflector is formed when the layers of the LED according to the invention are located on a substrate which is transparent to the emitted radiation and the underside of the substrate is provided with a layer (e.g., of Al, Ag, Cr or Au) reflecting the emitted radiation.

When channels are provided in the electrically insulating substrate, they can likewise be coated on their inner surfaces. Further, it is possible that the metallic conductor itself is a reflecting layer.

It is further possible that a current spreading layer of the second conductivity type is provided between the second barrier layer and the first contact layer for spreading current flowing between the first contact layer and the substrate contact over a conducting cross section.

In an extremely advantageous manner, a current spreading layer serves to generate a current flow across an entire electrically conductive cross section. This electrically conductive cross section corresponds to the horizontal cross section of the areas of the layers that are arranged in each instance below an emitting surface and is optically and electrically isolated laterally by the deep implanted regions of the series of layers. The advantageous effect of a layer of this kind consists in that there is a flow of current along the entire cross section of the active layer and a uniform, high light yield is made possible in this way. The material of the current spreading layer can be, for example, p-doped or n-doped AlInGaP or AlGaAs or InGaN, and the current spreading layer is transparent to the light emitted by the active layer.

The current spreading layer can comprise a conductive material which is transparent to the emitted radiation, e.g., indium tin oxide (ITO) or zinc oxide (ZnO). The substances mixed in with the material of the current spreading layer for doping are selected in such a way that the current spreading layer is the first conductivity type or second conductivity type and corresponds to the conductivity type of the second barrier layer.

The LED according to the invention can be arranged in an LED array in which a quantity of emitting surfaces are arranged in a pattern on a common substrate; patterns formed of rows and columns are preferred.

An LED array of this kind can be arranged in such a way that the LEDs of the array are controllable individually and independently from one another. In an advantageous embodiment, the deep implanted regions extend through all layers as far as an electrically insulating substrate. A second contact layer of a first conductivity type is then provided between a buffer layer and a reflector layer. It is also possible that the second contact layer is formed as buffer layer at the same time. The second contact layer can be an anode or cathode depending on the conductivity types.

It is advantageous when means are provided for selectively driving an LED so that no light is emitted through adjacently arranged LEDs that are not driven. Means of this kind can be any arrangements of contacts and a control of an LED array with LEDs according to the invention by which a selective driving of an LED can be achieved. A simple and preferred arrangement comprises intersecting, strip-shaped contacts extending in different layers above and below the active layer, respectively (multiplex driving). Further, it is possible to drive groups of LEDs collectively.

When an LED according to the invention is driven, current flows from the anode to the cathode when a sufficiently high voltage is applied. As was described above, depending on the doping of the layers arranged above and below the active layer, current can flow from the first contact layer to the substrate contact or second contact layer or the current flows from the substrate contact or second contact layer to the first contact layer. The lateral propagation of the current flow is limited by the deep implanted regions, which is why the current flow across the conducting cross section of the layers located below the emitting surface takes place substantially vertically in a directed manner. The emission of radiation takes place in the active layer in a known manner. Radiation emitted in direction of the substrate impinges on the reflector layer and is reflected by the latter in direction of the emitting surface. A lateral propagation of emitted radiation is countered by the optically isolating deep implanted regions.

BRIEF DESCRIPTION OF THE DRAWINGS

The invention will be described more fully in the following with reference to embodiment examples and drawings. The drawings show.

DESCRIPTION OF THE EMBODIMENTS

The series of layers in the following embodiment examples are produced by known methods for generating layered epitaxial structures. The surface implanted regions and deep implanted regions are also generated using known methods.

Figure 1:
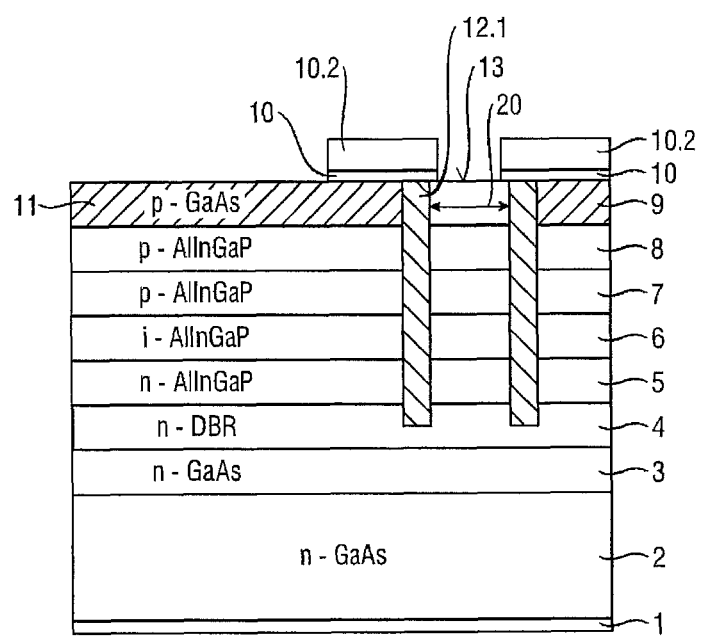
FIG. 1 a first embodiment of the LED according to the invention with an n-doped substrate.

A series of layers serving to emit yellow light in a wavelength range from 575 nm to 595 nm is arranged in a first embodiment of an LED according to FIG. 1.

Provided as bottom layer are a substrate contact 1 which is constructed as ohmic n-contact (cathode) and is made of gold and an n-doped substrate 2 which is made of a GaAs single crystal (gallium arsenide) and is connected to the substrate contact 1 in a planar manner so as to be electrically conducting. Arranged on top of the substrate 2 is a buffer layer 3 of n-GaAs followed by a reflector layer 4 which is formed as a distributed Bragg reflector (DBR) and structured in such a way that yellow light impinging on the reflector layer 4 from above is reflected again above the reflector layer 4. Located above the reflector layer 4 is a first barrier layer 5 of n-AlInGaP followed by an active layer 6 of i-AlInGaP and a second barrier layer 7 of AlInGaP. The bandgaps of the first barrier layer and second barrier layer are larger than the bandgap of the active layer 6. The active layer 6 is arranged as a multi-quantum well. In further embodiments, the active layer 6 can be formed as a p-doped layer or n-doped layer, as an undoped layer or as a quantum well.

In further embodiments, the substrate contact 1 can also be made of germanium or gold-germanium.

On top of the second barrier layer 7 are a current spreading layer 8 of p-AlInGaP and a first contact layer 9 of p-GaAs (anode).

Starting from the first contact layer 9, there is a first region 12.1 which is deep implanted by irradiation with protons so as to extend into the reflector layer. The first deep implanted region 12.1 has an annular cross section which remains constant along the perpendicular extension of the first deep implanted region 12.1. The surface of the cross section not associated with the first deep implanted region 12.1 is an electrically conducting cross section 20 (diameter shown). The areas of the layers penetrated by the first deep implanted region 12.1, which areas are associated with the conducting cross section 20, are optically and electrically isolated in lateral direction.

Around the first deep implanted region 12.1, the first contact layer 9 has a region 11 (shaded) which is surface implanted by irradiation with protons. On the surface of the first contact layer 9 there are surface contacts 10 through which the conducting cross section 20 is contacted uniformly over the entire circumference of the conducting cross section 20 on the surface of the first contact layer 9. The surface contacts 10 are completely covered by a bonding surface 10.2. The remaining free surface of the conducting cross section 20 at the surface of the first contact layer 9 presents an emitting surface 13, and light which is emitted in the active layer 6 and which reaches and penetrates the emitting surface 13 is emitted via this emitting surface. The active layer 6 is arranged 3 μm below the emitting surface 13. The attainable luminous intensity is 15 mcd per LED at 5 mA.

In further embodiments, the material of the first barrier layer 5 and second barrier layer 7, of the first contact layer 9, and of the active layer 6 can be on an absorbent substrate 2 for emission of blue and green radiation.

Figure 2:
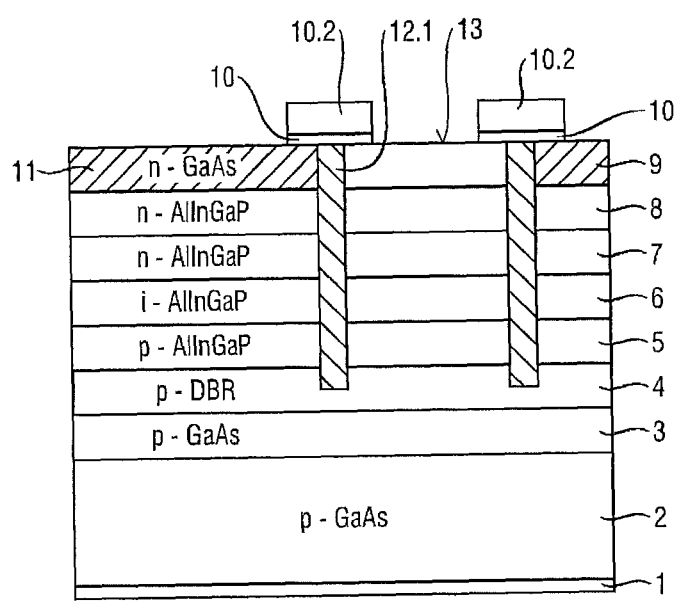
FIG. 2 a second embodiment of the LED according to the invention with a p-doped substrate.

A second embodiment of the LED according to FIG. 2 has the same layers in the same arrangement as the first embodiment and serves to emit red light in a wavelength range from 640 nm to 660 nm. The dopants of the materials differ from those of the first embodiment in that the individual layers are made of differently doped materials. Accordingly, substrate 2, buffer layer 3, reflector layer 4 and first barrier layer 5 are p-doped, while the second barrier layer 7, the current spreading layer 8 and the first contact layer 9 are n-doped. The active layer 6 is arranged 3 μm below the emitting surface 13.

Figure 3:
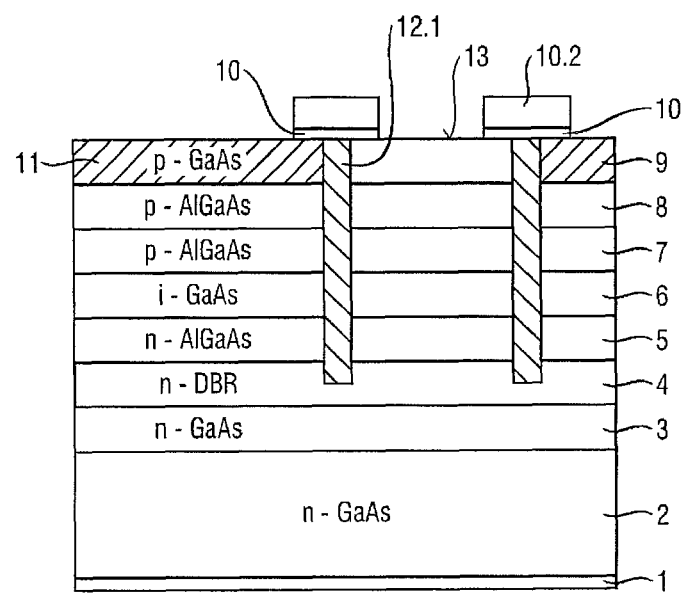
FIG. 3 a third embodiment of the LED according to the invention with an n-doped substrate.

In a third embodiment of the LED according to FIG. 3, all of the layers are again provided in the same arrangement as in the first and second embodiments. Infrared radiation of wavelength 860 nm is radiated by means of this construction. The substrate 2, buffer layer 3, reflector layer 4 and first barrier layer 5 are n-doped, while the second barrier layer 7, the current spreading layer 8 and the contact layer 9 are p-doped. In contrast to the first and second embodiments of the LED, the first barrier layer 5 and second barrier layer 7 and the current spreading layer 8 are made from doped AlGaAs. The active layer 6 is a multi-quantum well comprising AlGaAs and is arranged 3 μm below the emitting surface 13.

Figure 4:
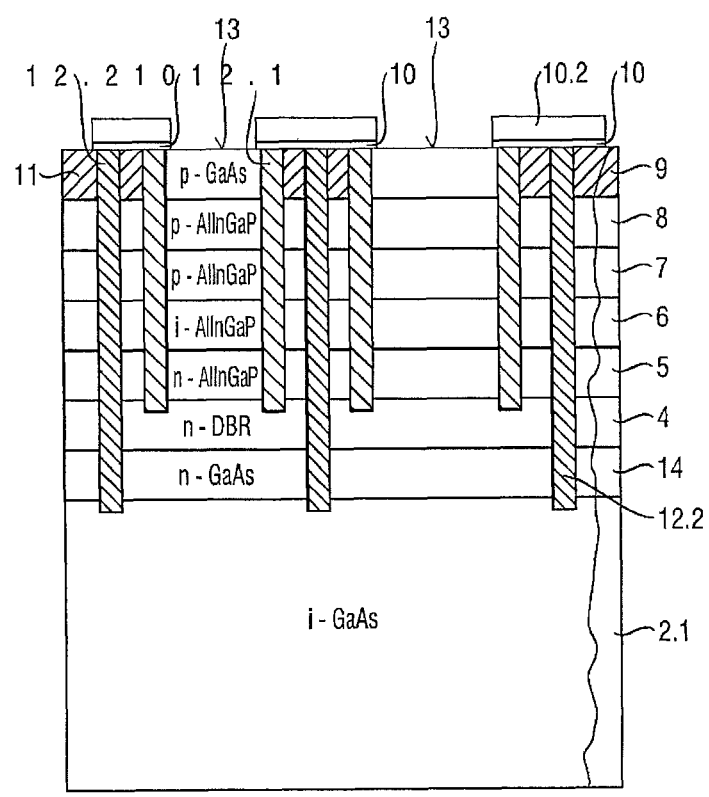
FIG. 4 a fourth embodiment of the LED according to the invention with an undoped substrate.

FIG. 4 shows two LEDs according to the invention in a fourth embodiment on a common substrate 2; the substrate 2 is an electrically insulating substrate 2.1 of undoped GaAs. Above the insulating layer 2.1, there is a second contact layer 14 of n-doped GaAs. Following on top of the latter is an n-doped reflector layer 4 formed as a DBR, a first barrier layer 5 of n-AlInGaP, a multi-quantum well of i-AlInGaP as active layer 6, a second barrier layer 7 of p-AlInGaP, a current spreading layer 8 of p-AlInGaP and a first contact layer 9 of p-GaAs. The first deep implanted regions 12.1 extend from the first contact layer 9 into the reflector layer 4. The surface contacts 10 and bonding surfaces 10.2 are arranged as in the first to third embodiments described above. Additionally, there are second deep implanted regions 12.2 extending parallel to one another which are formed proceeding from the first contact layer 9 into the insulating substrate 2.1. A second deep implanted region 12.2 is formed between the two LEDs and extends continuously from one side of the series of layers of the LED to the other side of the series of layers so that these layers isolate the two LEDs from one another optically and electrically over all of the layers. The LEDs are isolated from the sides of the series of layers by additional second deep implanted regions 12.2.

Figure 5:
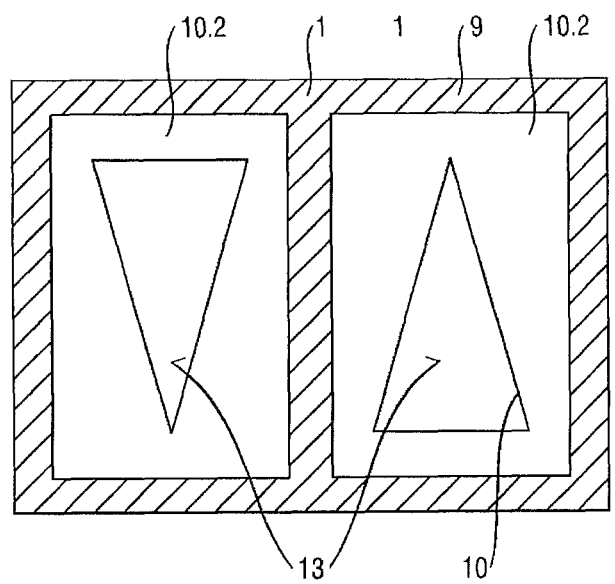
FIG. 5 a first arrangement of LEDs according to the invention in a top view.

Embodiments and arrangements of the LEDs according to the invention are shown in FIGS. 5 to 8. FIG. 5 shows an arrangement of two LEDs with triangular emitting surfaces 13. The first contact layer 9 has surface implanted regions 11 through which the two emitting surfaces 13 are optically and electrically isolated from one another. Bonding surfaces 10.2 are provided via the surface contacts 10 (not shown).

Figure 6:
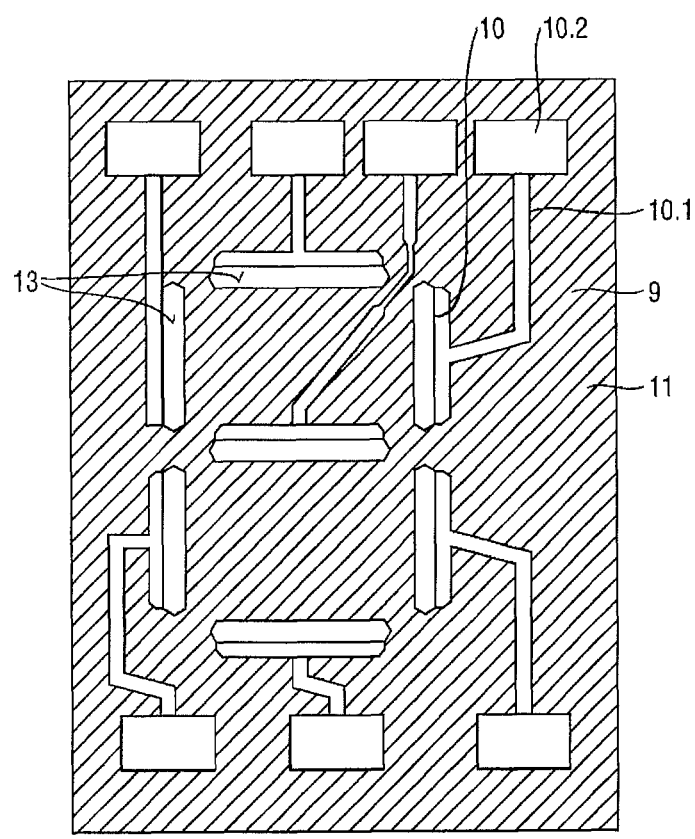
FIG. 6 a second arrangement of LEDs according to the invention in a numeric display in a top view.

The position of the emitting surfaces 13 in the first contact layer 9 can also be provided for displaying numerals according to FIG. 6. The emitting surfaces 13 of the total of seven LEDs are individually contacted via surface contacts 10 formed as strips 10.1 and are each connected in an electrically conducting manner to a bonding surface 10.2. Surface contacts 10 and emitting surfaces 13 are optically and electrically isolated from one another by surface implanted regions 11 and can accordingly be controlled individually and independently from one another.

Figure 7:
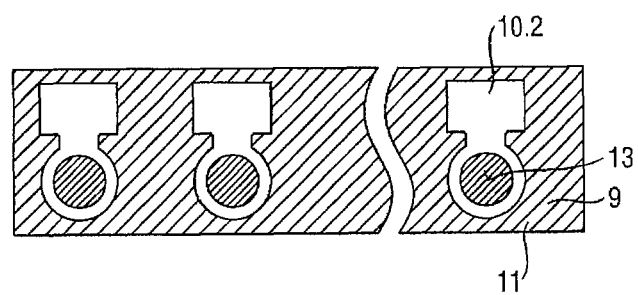
FIG. 7 a third arrangement of LEDs according to the invention in a top view.

A similar arrangement is shown in FIG. 7. Round emitting surfaces 13 which give off visible light or radiate infrared and which each have a diameter of 50 μm are contacted by separate, bonded surface contacts 10 and are individually controllable.

Figure 8:
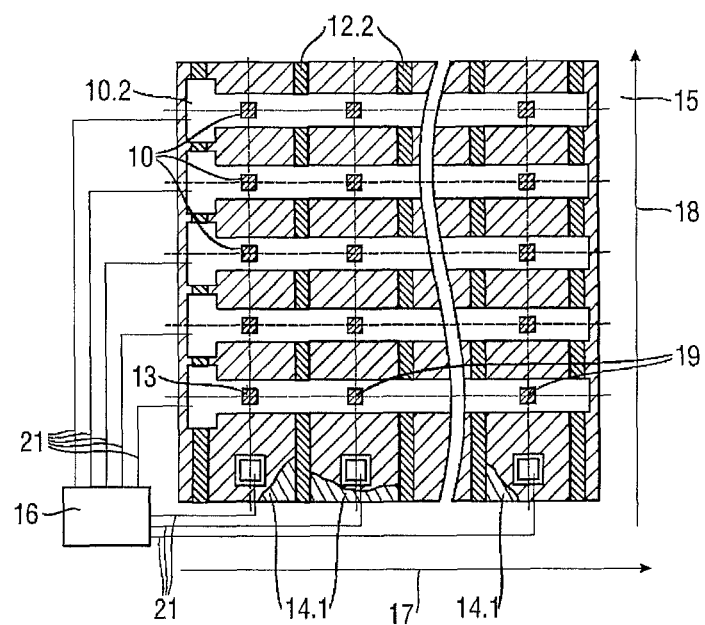
FIG. 8 an LED array with LEDs according to the invention in a top view.

In FIG. 8, a quantity of emitting surfaces 13 are arranged on a common insulating substrate 2.1 in an array 15 (LED array), wherein the series of layers corresponds to the fourth embodiment of the LEDs according to FIG. 4.

The surface contacts 10 are formed as strips 10.1 which are electrically isolated from one another by the surface implanted regions 11 of the first contact layer 9. A quantity of emitting surfaces 13 are contacted in each instance in a first direction 17 of the array 15 by the strips 10.1. The second contact layer 14 is formed as a quantity of strips 14.1 which are electrically isolated from one another and which extend in a second direction 18 of the array 15 oriented perpendicular to the first direction 17 of the array 15 so that when viewed from above the strips 10.1 extending in the first direction 17 and the strips 14.1 extending in the second direction 18 form a grid (indicated in dashes) with intersection points 19 of the strips 10.1 and 14.1, and each emitting surface 13 is arranged in each instance over one of the intersection points 19. The strips 10.1 can be connected by bonding surfaces 10.2 located at one of their ends. At one of their ends, proceeding from the first contact layer 19, the strips 14.1 are exposed pointwise by chemical etching or plasma etching. The exposed areas of the strips 14.1 can be connected individually.

Further, there is provided a control 16 which is constructed so as to be selectively connectable to strips 10.1 and strips 14.1 in each instance by conductors 21 so that a directed flow of current between a strip 10.1 and a strip 14.1 can be initiated in a controllable manner perpendicular to an intersection point 19 by means of the control 16 for each emitting surface 13 individually and independently from other emitting surfaces 13.

In further embodiments, the strips 14.1 can have bonding surfaces 10.2 projecting from the series of layers or can be exposed pointwise or area-wise by other known methods.

Figure 9:
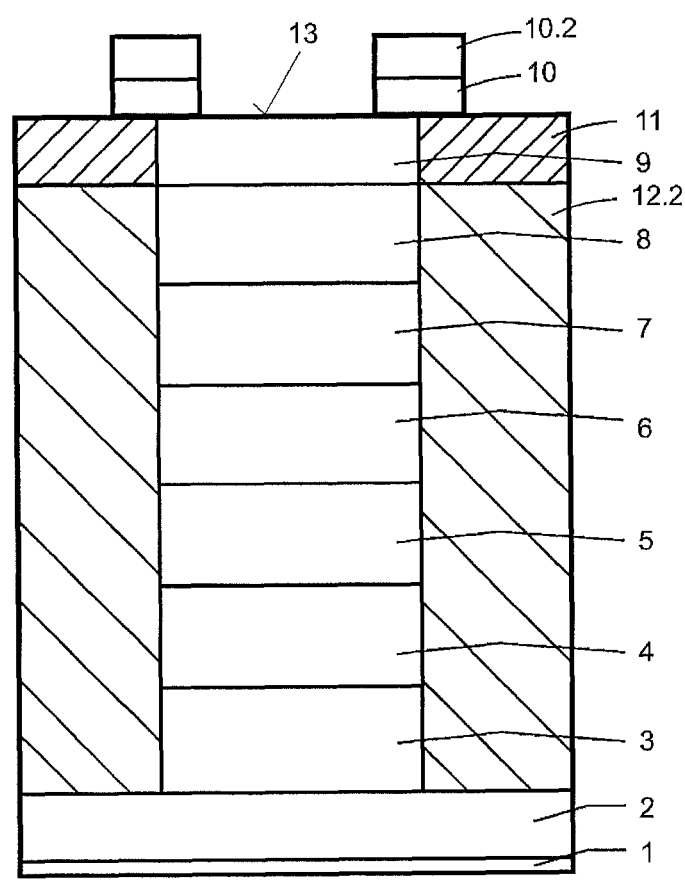
FIG. 9 a fifth embodiment of the LED according to the invention with surface implanted and deep implanted regions of identical horizontal dimensioning.

A fifth embodiment of an LED according to the invention is shown in FIG. 9. The surface implanted regions 11 and the deep implanted regions 12 have the same horizontal dimensions and are arranged in coextensive relation one below the other. Two vertically extending regions (shaded areas at left and right) which are arranged so as to be separated from one another in horizontal direction are formed with surface implanted regions 11 and deep implanted regions 12 arranged in coextensive relation one above the other. The deep implanted regions 12 are formed as second deep implanted regions 12.2 and extend from the surface implanted regions 11 to the substrate 2. The substrate 2 has the first conductivity type or second conductivity type.

Figure 10:
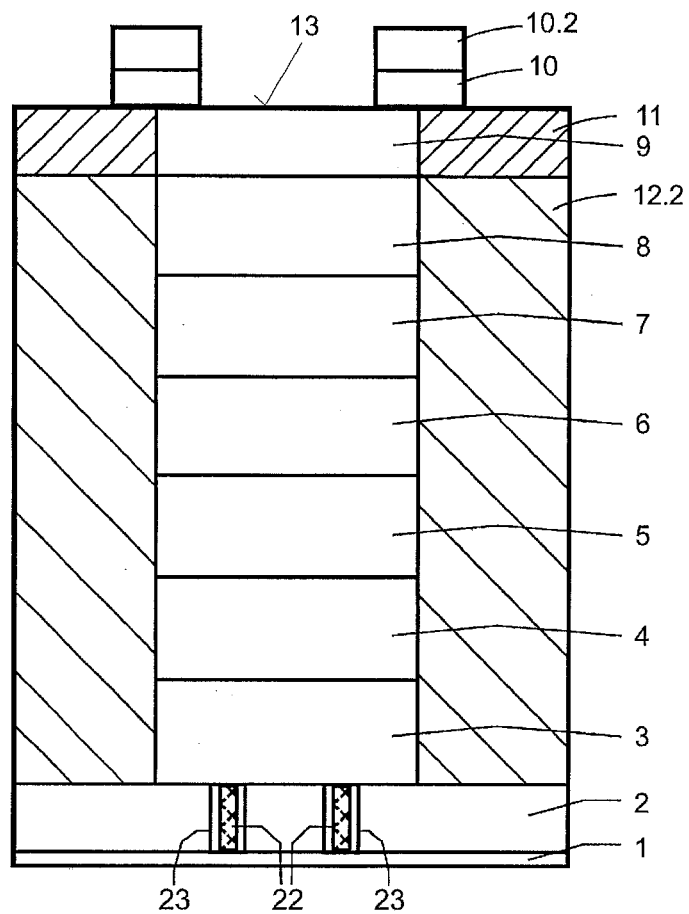
FIG. 10 a sixth embodiment of the LED according to the invention with surface implanted and deep implanted regions of identical horizontal dimensioning, insulating substrate, and omnidirectional reflector.

FIG. 10 shows a sixth embodiment of an LED according to the invention which corresponds to the basic construction according to FIG. 9. In the sixth embodiment, an electrically insulating substrate 2.1 is provided and two vertically extending channels 23 are contained in the electrically insulating substrate 2.1, a metallic conductor 22 being arranged in each channel 23 in such a way that the substrate contact 1 and the buffer layer 3 are contacted by the metallic conductor 22 and are connected to one another in an electrically conducting manner. The buffer layer 3 is contacted by the metallic conductor 22 below the emitting surface 13. The electrically insulating substrate 2.1 is transparent to the emitted radiation and has a gold coating on its underside. Through the electrically insulating substrate 2.1 which is coated in this way, in combination with the layers of the LED according to the invention which are arranged above the electrically insulating substrate 2.1, an omni-bidirectional reflector is formed.

Figure 11:
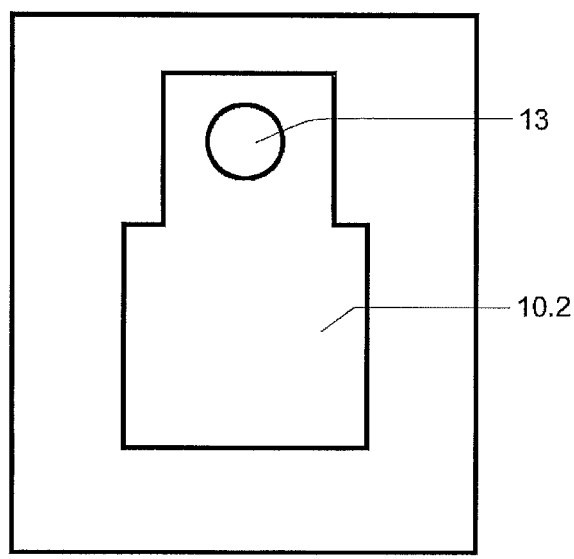
FIG. 11 an LED according to the invention as spot emitter in a top view.

In an application of the LED according to the invention shown in FIG. 11, a so-called spot emitter chip is shown in a top view. The emitting surface 13 is circularly shaped, is surrounded by the bonding surface 10.2 and has a diameter of 50 μm. In further embodiments, the diameter can be smaller, e.g., 25 μm, or larger, e.g., 150 μm. Radiation with a wavelength of 650 nm (red) is emitted, and visible emissions are obtained already starting from 400 nA. The luminous intensity is about five times greater compared to a first-generation spot emitter chip. The spot emitter chip allows a high current load of 200 A/cm$^2$ and short switching times (<5 ns). Since spot emitter chips have a lifetime of over 100,000 h (at 100 A/cm$^2$), they are especially suited for use in data transmission. A high efficiency of the LED according to the invention in the spot emitter chip allows a long battery life for non-stationary application of spot emitter chips or of equipment and installations containing spot emitter chips.

Accordingly, these spot emitter chips can be used, e.g., for VCSEL substitutions without speckle, as a radiation source for rotary position sensors (encoders), as miniature light points for sighting optics, as a focused beam for light barriers and point line arrays for laser printers.

The LEDs according to the invention can be used in many fields. For example, they are also suitable for the backlighting of displays for displaying visually observable graphic characters or for reflecting visually observable graphic characters into the beam path of an optical arrangement. Owing to the high light intensity of the LEDs, losses occurring as a result of absorption, partial reflection, scattering and/or interference can easily be compensated. Further, because of their favorable contrast characteristics, the LEDs according to the invention can also be used for displaying small and/or high-resolution graphic characters.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

LIST OF REFERENCE NUMERALS 1 substrate contact
2 substrate
2.1 electrically insulating substrate
3 buffer layer
4 reflector layer
5 first barrier layer
6 active layer
7 second barrier layer
8 current spreading layer
9 first contact layer
10 surface contacts 10.1 strips
10.2 bonding surface
11 surface implanted region
12 deep implanted regions
12.1 first deep implanted region
12.2 second deep implanted region
13 emitting surface
14 second contact layer
14.1 strip
15 array
16 control
17 first direction
18 second direction
19 intersection point
20 conducting cross section
21 conductor
22 metallic conductor
23 channel

What is claimed is:

1. A surface emitting semiconductor light-emitting diode (LED) comprising in a series one above the other:
   a layer of a substrate contact of a first conductivity type,
   a common substrate,
   a first barrier layer of the first conductivity type,
   a light-emitting active layer,
   a second barrier layer of a second conductivity type,
   a first contact layer of the second conductivity type, and
      surface implanted regions in the first contact layer which are electrically isolated from one another by irradiating with electric charge carriers, and a quantity of electrically conductive surface contacts for producing contact with the first contact layer, and wherein
   the substrate comprises a semiconductor substrate and the substrate has a first conductivity type, or the substrate is an electrically insulating substrate, or the substrate comprises a metal or a composite material, and a reflector layer of the first conductivity type is provided between the substrate and the first barrier layer, said first contact layer having at least one emitting surface via
   which radiation emitted by the active layer exits the LED, and the emitting surfaces are electrically and optically isolated from one another by surface implanted regions in the first contact layer which are irradiated with electric charge carriers, and wherein the areas of the layers located below the emitting surface
   starting from the first contact layer and proceeding as far as at least through the active layer are electrically and optically isolated with respect to areas of the layers not located below the emitting surface by means of first deep implanted regions irradiated with electric charge carriers.

2. The LED according to claim 1, wherein the first conductivity type and the second conductivity type are selected from a group comprising the p-doped semiconductor conductivity type and the n-doped semiconductor conductivity type, and the first conductivity type and the second conductivity type differ from one another.

3. The LED according to claim 2, wherein the first barrier layer and the second barrier layer each have a bandgap which is greater than the bandgap of the active layer.

4. The LED according to claim 3, wherein the materials of the first barrier layer and second barrier layer, first contact layer and active layer are selected from a group comprising $(Al_xGa_{1-x})_{1-z}In_zP$ and $Al_xGa_{1-x})_{1-x}As$, where $0 \le x \le 1$ and $0 \le z \le 0.6$.

5. The LED according to claim 4, wherein the materials of the first barrier layer and second barrier layer, first contact layer and active layer comprise $Al_xGa_yIn_zN$, where $x+y+z=1$, $0 \le x \le 1$, $0 \le y \le 1$, $0 \le z \le 0.5$.

6. The LED according to claim 4, wherein the materials of the first barrier layer and second barrier layer, first contact layer and active layer comprise $In_yGa_{1-y}N$, where $0 \le y \le 0.5$ and the substrate is selected from a group comprising germanium, silicon, and metal alloys.

7. The LED according to claim 1, wherein the active layer comprises an undoped or a p-doped material or an n-doped material and is arranged no deeper than 4 μm below the emitting surfaces.

8. The LED according to claim 1, wherein the active layer is formed as a quantum well or multi-quantum well and is arranged no deeper than 4 μm below the emitting surfaces.

9. The LED according to claim 1, wherein the substrate comprises a doped material selected from a group comprising Si, GaAs, Ge, and metal alloys.

10. The LED according to claim 1, wherein the substrate is an electrically insulating substrate.

11. The LED according to claim 10, wherein the electrically insulating substrate comprises a material selected from a group comprising sapphire, si-AlN, $MgAl_2O_4$— spinel, metal oxides, or composites.

12. The LED according to claim 1, wherein a buffer layer of the first conductivity type is provided between substrate and first barrier layer to compensate for crystalline structures of the layers that differ from one another.

13. The LED according to claim 1, wherein the reflector layer is a distributed Bragg reflector (DBR).

14. The LED according to claim 1, wherein a current spreading layer of the second conductivity type which is transparent to the emitted radiation is provided between the second barrier layer and the first contact layer for spreading a current flowing between the first contact layer and the substrate contact over a conducting cross section.

15. The LED according to claim 14, wherein the current spreading layer comprises a transparent, conductive material.

16. The LED according to claim 1, wherein the substrate contact and the surface contacts are constructed as bonding surfaces in that they are at least partially covered by a bonding layer.

17. The LED according to claim 10, wherein the substrate contact is connected to the buffer layer by at least one metallic conductor which is arranged so as to run through at least one channel provided in the electrically insulating substrate.

18. The LED according to claim 17, wherein the substrate contact is coated on its underside with a layer reflecting the emitted radiation and, together with the at least one metallic conductor in the insulating substrate and the buffer layer, forms an omnidirectional reflector.

19. The LED according to claim 1, wherein the surface implanted regions and the first deep implanted regions are electrically and optically isolating through irradiation of the series of layers with electric charge carriers of different kinetic energies and quantities of electric charge carriers per cross-sectional area of a beam bundle used for the irradiation, wherein the surface implanted regions are generated with lower kinetic energies and higher quantities of electric charge carriers per cross-sectional area of the beam bundle compared to the deep implanted regions.

20. The LED according to claim 16, wherein different ions are used as charge carriers for different light-emitting diode materials.

21. The LED according to claim 16, wherein surface implanted regions and deep implanted regions have coextensive horizontal dimensions but differ from one another vertically as a result of the concentration and type of ions and were produced consecutively in only one implantation process.

22. The LED according to claim 1, wherein a quantity of emitting surfaces are arranged in a pattern (array) on a common substrate.

23. The LED according to claim 22, wherein, in addition to the first deep implanted regions, there are second deep implanted regions extending through all of the layers as far as the electrically insulating substrate, and a second contact layer of a first conductivity type is provided between the buffer layer and the reflector layer, a current spreading layer of the second conductivity type is provided between second barrier layer and first contact layer, and further the surface contacts are formed as strips which are electrically isolated from one another and through which a quantity of emitting surfaces are contacted in each instance in a first direction of the array, and the second contact layer is formed as a quantity of strips which are electrically isolated from one another and which extend in a second direction of the array oriented perpendicular to the first direction of the array so that when viewed from above the strips extending in the first direction and the strips extending in the second direction form a grid with intersection points of the strips, and each emitting surface is arranged in each instance over one of the intersection points.

24. The LED according to claim 23, wherein strips in the first direction and strips in the second direction are constructed such that contact can be made with them selectively by means of a control so that a directed flow of current between a strip and a strip is controllable perpendicular to an intersection point by means of the control for each individual emitting surface independently from other emitting surfaces.

25. Use of an LED or an LED array according to one of the preceding claims for reflecting visually observable graphic characters into the beam path of an optical arrangement.

* * * * *